(12) United States Patent
Lu et al.

(10) Patent No.: US 12,183,271 B2
(45) Date of Patent: Dec. 31, 2024

(54) PIXEL ARRAY AND DISPLAY APPARATUS

(71) Applicant: BOE TECHNOLOGY GROUP CO., LTD., Beijing (CN)

(72) Inventors: Jiangnan Lu, Beijing (CN); Shiming Shi, Beijing (CN); Hui Zhao, Beijing (CN); Libin Liu, Beijing (CN); Yanyan Wang, Beijing (CN); Weiwei Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/913,894

(22) PCT Filed: Oct. 29, 2021

(86) PCT No.: PCT/CN2021/127381
§ 371 (c)(1),
(2) Date: Sep. 23, 2022

(87) PCT Pub. No.: WO2022/166277
PCT Pub. Date: Aug. 11, 2022

(65) Prior Publication Data
US 2024/0212590 A1    Jun. 27, 2024

(30) Foreign Application Priority Data

Feb. 2, 2021 (CN) .......................... 202120309047.1

(51) Int. Cl.
*G09G 3/3208* (2016.01)
*H10K 59/35* (2023.01)

(52) U.S. Cl.
CPC .......... *G09G 3/3208* (2013.01); *H10K 59/352* (2023.02); *H10K 59/353* (2023.02); *G09G 2300/0439* (2013.01)

(58) Field of Classification Search
CPC .......... G09G 3/3208; G09G 2300/0439; H01K 59/352; H01K 59/353
See application file for complete search history.

(56) References Cited

U.S. PATENT DOCUMENTS

2016/0247433 A1\* 8/2016 Guo ..................... G09G 3/2003
2016/0322433 A1   11/2016 Kim et al.
(Continued)

FOREIGN PATENT DOCUMENTS

CN    109686777 A    4/2019
CN    109994503 A    7/2019
(Continued)

*Primary Examiner* — Stephen G Sherman
(74) *Attorney, Agent, or Firm* — HOUTTEMAN LAW LLC

(57) ABSTRACT

The present disclosure provides a pixel array and a display apparatus. The pixel array includes a plurality of first sub-pixels having a first color, a plurality of second sub-pixels having a second color, and a plurality of third sub-pixels having a third color; wherein at least a portion of at least one first sub-pixel of the plurality of first sub-pixels includes an inward indentation, at least a portion of at least one second sub-pixel of the plurality of second sub-pixels includes an inward indentation, and at least one of the plurality of third sub-pixels adjacent to the at least one second sub-pixel includes an outward protrusion corresponding to the inward indentation of the at least one second sub-pixel.

17 Claims, 5 Drawing Sheets

(56) References Cited

U.S. PATENT DOCUMENTS

2017/0124940 A1* 5/2017 Hsu .................. G09G 3/3208
2018/0165533 A1* 6/2018 Cho .................. G09G 5/003

FOREIGN PATENT DOCUMENTS

| CN | 109994504 A | 7/2019 |
| CN | 110867481 A | 3/2020 |

* cited by examiner

PIXEL ARRAY AND DISPLAY APPARATUS

TECHNICAL FIELD

The present disclosure relates to the field of display technology, and in particular to a pixel array and a display apparatus.

BACKGROUND

An organic light emitting diode (OLED) display device is one hot spot in the research field of flat panel displays. Compared with a liquid crystal display, the OLED display device has the advantages of low energy consumption, low production cost, self-luminescence, wide viewing angle, fast response speed, and the like. Currently, in the field of flat panel displays such as mobile phones, tablet computers, and digital cameras, the OLED display device has replaced the conventional liquid crystal display (LCD).

A structure of the OLED display device mainly includes: a substrate and pixels arranged in an array on the substrate. Pixels are generally formed by using an evaporation film formation technology to enable an organic material to penetrate through a fine metal mask, and forming an organic light-emitting device at a corresponding pixel position on an array substrate.

SUMMARY

According to one aspect of the present disclosure, there is provided a pixel array, including a plurality of first sub-pixels having a first color, a plurality of second sub-pixels having a second color, and a plurality of third sub-pixels having a third color: wherein the plurality of first sub-pixels and the plurality of third sub-pixels are alternately arranged in a first direction, to form a plurality of first sub-pixel rows: the plurality of second sub-pixels are arranged in the first direction, to form a plurality of second sub-pixel rows: the plurality of first sub-pixel rows and the plurality of second sub-pixel rows are alternately arranged in a second direction: and the plurality of first sub-pixels and the plurality of third sub-pixels are alternately arranged in the second direction, to form a plurality of first sub-pixel columns: the plurality of second sub-pixels are arranged in the second direction, to form a plurality of second sub-pixel columns: the plurality of first sub-pixel columns and the plurality of second sub-pixel columns are alternately arranged in the first direction: the second direction is different from the first direction, and wherein at least a portion of at least one first sub-pixel of the plurality of first sub-pixels is depressed inward, at least a portion of at least one second sub-pixel of the plurality of second sub-pixels is depressed inward, and at least one of the plurality of third sub-pixels adjacent to the at least one second sub-pixel protrudes away from the interior of the at least one third sub-pixel corresponding to the depression of the at least one second sub-pixel.

In some embodiments, lines, sequentially connecting centers of two first sub-pixels and centers of two third sub-pixels in two adjacent first sub-pixel rows of the plurality of first sub-pixel rows and two adjacent first sub-pixel columns of the plurality of first sub-pixel columns, constitute a first virtual square, and one of the plurality of second sub-pixels is at a center of the first virtual square: and the centers of the two first sub-pixels and the centers of the two third sub-pixels are respectively at four vertexes of the first virtual square.

In some embodiments, at least one of the plurality of second sub-pixels includes a first side and a second side respectively close to two adjacent third sub-pixels and opposite to each other, the first side and the second side of the at least one of the plurality of second sub-pixels are symmetrically arranged about a line connecting a center of the second sub-pixel and a center of an adjacent third sub-pixel in the first virtual square, which in turn passes through centers of the first side and the second side.

In some embodiments, the at least one of the plurality of second sub-pixels includes a third side and a fourth side respectively close to two adjacent first sub-pixels and opposite to each other, the third side and the fourth side of the at least one of the plurality of second sub-pixels are symmetrically arranged about a line connecting a center of the second sub-pixel with a center of an adjacent first sub-pixel in the first virtual square, which in turn passes through centers of the third side and the fourth side.

In some embodiments, the centers of the first and second sides of the at least one of the plurality of second sub-pixels are close to the center of the second sub-pixel in the first virtual square with respect to points, other than the centers of the first and second sides along a direction of the line connecting the center of the second sub-pixel and the center of the adjacent third sub-pixel in the first virtual square.

In some embodiments, the centers of the third side and the fourth side of the at least one of the plurality of second sub-pixels are away from the center of the second sub-pixel in the first virtual square with respect to points, other than the centers of the third side and the fourth side along a direction of the line connecting the center of the second sub-pixel and the center of the adjacent first sub-pixel in the first virtual square.

In some embodiments, each of the first and second sides has a length greater than that of each of the third and fourth sides.

In some embodiments, the first, second, third, and fourth sides are each arc-shaped.

In some embodiments, two adjacent first virtual squares share a common side, and two second sub-pixels of the two adjacent first virtual squares are symmetrically arranged along the common side.

In some embodiments, the first color is red, the second color is green, and the third color is blue.

In some embodiments, a ratio among a first minimum distance $d12$ between each of the plurality of first sub-pixels and an adjacent one of the plurality of second sub-pixels, a second minimum distance $d13$ between each of the plurality of first sub-pixels and an adjacent one of the plurality of third sub-pixels, and a third minimum distance $d23$ between each of the plurality of second sub-pixels and an adjacent one of the plurality of third sub-pixels is $d12: d13: d23=1: (0.8$ to $1.2): (0.8$ to $1.2)$.

In some embodiments, each of the first minimum distance, the second minimum distance, and the third minimum distance is in a range of 14.4 μm to 21.6 μm.

In some embodiments, each of the first minimum distance, the second minimum distance, and the third minimum distance is 18 μm.

In some embodiments, a ratio among an area $S1$ of one of the plurality of first sub-pixels, a sum $S2$ of areas of two of the plurality of second sub-pixels, and an area $S3$ of one of the plurality of third sub-pixels is $S1:S2:S3=7.1:(5.6$ to $8.4):(10.4$ to $15.6)$.

In some embodiments, the ratio among the area $S1$ of one of the plurality of first sub-pixels, the sum $S2$ of areas of two of the plurality of second sub-pixels, and the area S3 of one of the plurality of third sub-pixels is S1:S2:S3=7.1:7:13.

In some embodiments, the first direction is perpendicular to the second direction, and the line connecting the center of the second sub-pixel and the center of the adjacent third sub-pixel in the first virtual square is perpendicular to the line connecting the center of the second sub-pixel and the center of the adjacent first sub-pixel in the same first virtual square, and has an included angle with the first direction in a range from 36° to 54°.

In some embodiments, at least one of the plurality of first sub-pixels includes fifth and sixth sides opposite to each other and seventh and eighth sides opposite to each other: the fifth and sixth sides of the at least one of the plurality of first sub-pixels are symmetrically arranged about a line connecting the center of the first sub-pixel and the center of the second sub-pixel adjacent to the fifth or sixth side, which in turn passes through centers of the fifth and sixth sides: and the seventh and eighth sides of the at least one of the plurality of first sub-pixels are symmetrically arranged about a line connecting the center of the first sub-pixel and the center of the second sub-pixel adjacent to the seventh or eighth side, which in turn passes through centers of the seventh and eighth sides.

In some embodiments, the centers of the fifth side and the sixth side of the at least one of the plurality of first sub-pixels are close to the center of the first sub-pixel with respect to points, other than the centers of the fifth and sixth sides along a direction of the line connecting the center of the first sub-pixel and the center of the second sub-pixel adjacent to the fifth or sixth side: and the centers of the seventh and eighth sides of the at least one of the plurality of first sub-pixels are close to the center of the first sub-pixel with respect to points, other than the centers of the seventh and eighth sides along a direction of the line connecting the center of the first sub-pixel and the center of the second sub-pixel adjacent to the seventh or eighth side.

In some embodiments, the fifth, sixth, seventh, and eighth sides are equal in length, and are each arc-shaped.

According to another aspect of the present disclosure, there is further provided a display apparatus including the pixel array and a driving circuit for driving the pixel array.

DETAIL DESCRIPTION OF EMBODIMENTS

In order to enable one of ordinary skill in the art to better understand the technical solutions of the present disclosure, the present invention will be described in further detail with reference to the accompanying drawings and the detailed description.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. Further, the term "a", "an", "the", or the like used herein does not denote a limitation of quantity, but rather denotes the presence of at least one element. The term of "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

Before describing a pixel array and a display apparatus of the embodiments of the present disclosure, a sub-pixel, a first sub-pixel, a second sub-pixel, a third sub-pixel, and the like, which are mentioned in the following description, will be explained. In the embodiments of the present disclosure, the sub-pixel refers to a structure of a light emitting device, and the first sub-pixel, the second sub-pixel, and the third sub-pixel represent three sub-pixels with different colors. In the embodiment of the present disclosure, as an example, the first sub-pixel is a red sub-pixel, the second sub-pixel is a green sub-pixel, and the third sub-pixel is a blue sub-pixel. However, the first sub-pixel is a red sub-pixel, the second sub-pixel is a green sub-pixel, and the third sub-pixel is a blue sub-pixel, which does not limit the scope of the embodiments of the present disclosure.

A shape of each sub-pixel generally depends on a shape of an opening in a pixel defining layer where a light emitting layer is formed, which defines a shape of a light emitting region of the sub-pixel, that is, the shape of the sub-pixel in the embodiments of the present disclosure. For example, when the shape of the opening is a quadrangle, the shape of the sub-pixel is a quadrangle.

Figure 1:
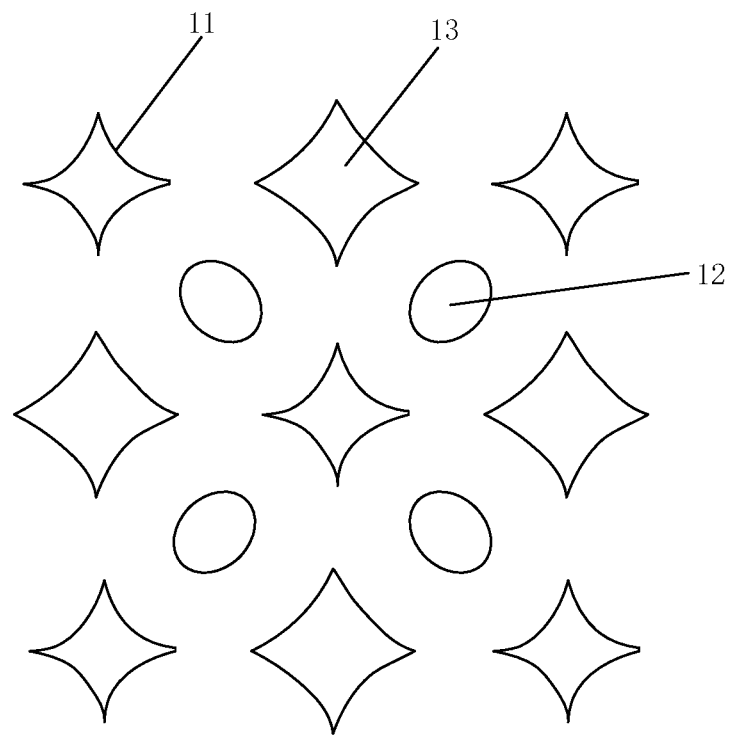
FIG. 1 is a schematic diagram of a pixel array in the related art.

FIG. 1 is a schematic diagram of an arrangement of pixels in the related art. As shown in FIG. 1, sub-pixels of three colors, such as, a red first sub-pixel 11, a green second sub-pixel 12, and a blue third sub-pixel 13, are included, and are arranged, for example, in a diamond structure. However, it is an urgent problem to be solved in the industry how to increase an aperture ratio of the sub-pixels arranged in the diamond arrangement, so as to increase the resolution of the display apparatus.

Figure 2:
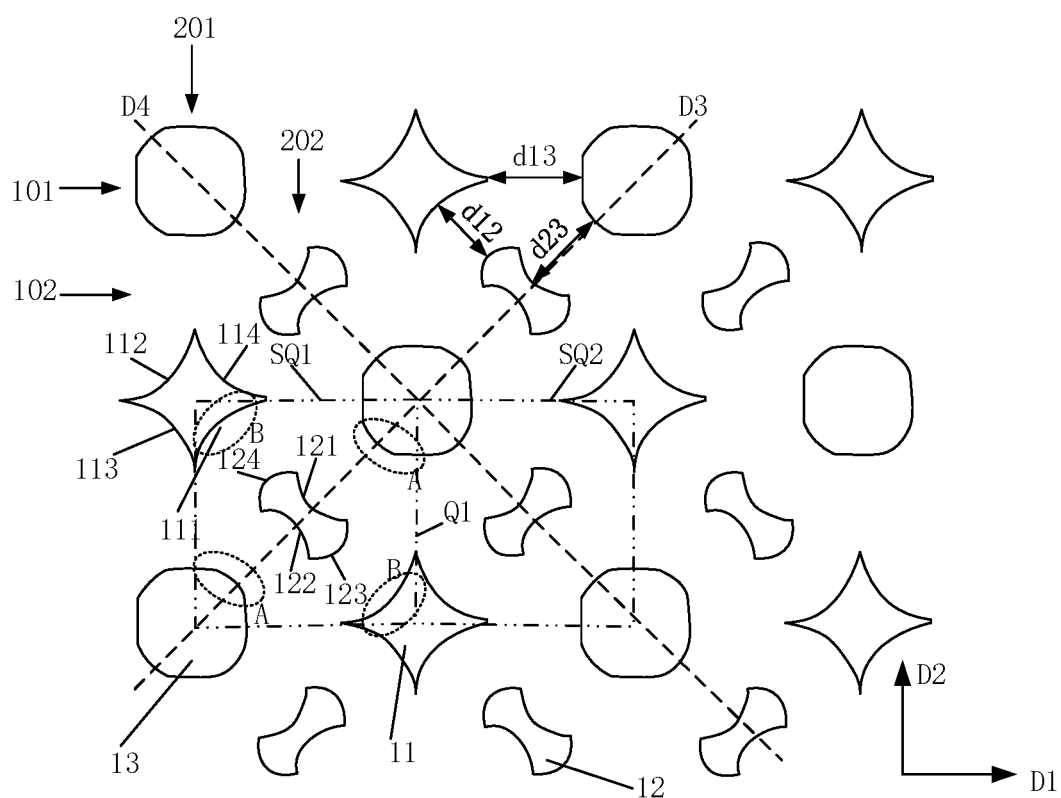
FIG. 2 is a schematic diagram of a pixel array according to an embodiment of the present disclosure.

Thus, according to one aspect of the present disclosure, a pixel array is provided. FIG. 2 is a schematic diagram of a pixel array according to an embodiment of the present disclosure. As shown in FIG. 2, the pixel array includes a plurality of first sub-pixels 11 having a first color, a plurality of second sub-pixels 12 having a second color, and a plurality of third sub-pixels 13 having a third color. In the present disclosure, as an example, the first color is red, the second color is green, and the third color is blue, but the present disclosure is not limited thereto.

As shown in FIG. 2, the first and third sub-pixels 11 and 13 are alternately arranged in a first direction D1 to form a plurality of first sub-pixel rows 101, and the second sub-pixels 12 are arranged in the first direction D1 to form a plurality of second sub-pixel rows 102. The plurality of first sub-pixel rows 101 and the plurality of second sub-pixel rows 102 are alternately arranged in a second direction D2.

Also, the first and third sub-pixels 12 and 13 are also alternately arranged in the second direction D2 to form a plurality of first sub-pixel columns 201, and the second sub-pixels 12 are also arranged in the second direction D2 to form a plurality of second sub-pixel columns 202. The plurality of first sub-pixel columns 201 and the plurality of second sub-pixel columns 202 are alternately arranged along the first direction D1. The second direction D2 is different from the first direction D1. Optionally, the second direction D2 is perpendicular to the first direction D1.

Specifically, as shown in FIG. 2, the first sub-pixels 11 and the third pixels 13 are alternately arranged in a row direction (the first direction D1) and in a column direction (the second direction D2), and form corresponding first sub-pixel rows 101 and first sub-pixel columns 201: the second sub-pixels 12 are alternately arranged in the row direction (the first direction D1) and in the column direction (the second direction D2), and form corresponding second sub-pixel rows 102 and second sub-pixel columns 202. The number of the first sub-pixel rows 101 may be an odd number and the number of the second sub-pixel rows 102 may be an even number, or the number of the first sub-pixel rows 101 may be an even number and the number of the second sub-pixel rows 102 may be an odd number. The number of the first sub-pixel columns 201 may be an odd number and the number of the second sub-pixel columns 202 may be an even number, or the number of the first sub-pixel columns 201 may be an even number and the number of the second sub-pixel columns 202 may be an odd number.

As shown in FIG. 2, at least a portion of at least one second sub-pixel 12 of the plurality of second sub-pixels 12 is disposed to be depressed inward, at least a portion of at least one first sub-pixel 11 of the plurality of first sub-pixels 11 is disposed to be depressed inward, and at least one of the plurality of third sub-pixels 13 adjacent to the at least one second sub-pixel 12 is disposed to protrude away from the interior of the at least one third sub-pixel 13 corresponding to the depression of the at least one second sub-pixel 12. The depression here means that at least a portion of each of the first sub-pixel 11 and the second sub-pixel 12 protrudes inward with respect to the other portions, so that the at least a portion is depressed inward with respect to the other portions. The second sub-pixel 12 is depressed inward, so that an area of the second sub-pixel 12 may be reduced: the third sub-pixel 13 protrudes with respect to the depressed portion of the at least one second sub-pixel 12, so that an area of the third sub-pixel 13 may be increased. Especially, the area of the blue third sub-pixel 13 having the shortest lifetime is increased, and the lifetime of the display panel may be extended, but the present disclosure is not limited thereto. Optionally, at least one of the plurality of first sub-pixels 11 adjacent to the at least one second sub-pixel 12 may be disposed to be depressed inward, so as to reduce an area of the first sub-pixel 11, and further increase the area of the third sub-pixel 13.

Optionally, as shown in FIG. 2, lines, sequentially connecting centers of two first sub-pixels 11 and centers of two third sub-pixels 13 in two adjacent first sub-pixel rows of the plurality of first sub-pixel rows 101 and two adjacent first sub-pixel columns of the plurality of first sub-pixel columns 201, constitute a first virtual square. As shown in FIG. 2, one of the plurality of second sub-pixels 12 is located at a center of the first virtual square, and the centers of the two first sub-pixels 11 and the centers of the two third sub-pixels 13 are located at four vertices of the first virtual square, respectively.

At least one of the plurality of second sub-pixels 12 includes a first side 121 and a second side 122 respectively close to two adjacent third sub-pixels 13 and opposite to each other, the first side 121 and the second side 122 are symmetrically disposed about a line connecting a center of the second sub-pixel 12 and a center of an adjacent third sub-pixel 13 in the first virtual square, which in turn passes through centers of the first side 121 and the second side 133. The centers of the first and second sides 121 and 122 are close to the center of the second sub-pixel 12 in the first virtual square with respect to points, other than the centers of the first and second sides 121 and 122 along a direction of the line connecting the center of the second sub-pixel 12 and the center of the adjacent third sub-pixel 13 in the first virtual square. That is, the first side 121 and the second side are depressed toward the inside of the second sub-pixel 12 along the direction of the line connecting the center of the second sub-pixel 12 and the center of the adjacent third sub-pixel 13 in the first virtual square.

As shown in FIG. 2, the second sub-pixel 12 formed in this way is shaped like a "bone", resulting in that an aperture ratio (or area) of the second (green) sub-pixel 12 of the present disclosure is less than that of the second (green) sub-pixel in the related art shown in FIG. 1, and thus, an aperture ratio of the third (blue) sub-pixel 13 having the shortest lifetime and adjacent to the second sub-pixel 12 may be increased, and the lifetime of the blue sub-pixel may be improved.

As shown in FIG. 2, within a first virtual square SQ1, the line connecting the center of the second sub-pixel 12 and the center of the adjacent third sub-pixel 13 extends along a third direction D3: within a first virtual square SQ2 adjacent to the first virtual square SQ1, a line connecting the centers of the second sub-pixel 12 and the adjacent third sub-pixel 13 extends along a fourth direction D4. The third direction D3 and the fourth direction D4 intersect each other and are different from the first direction D1 and the second direction D2. That is, four second sub-pixels 12 are disposed around one third sub-pixel 13, and two of the four second sub-pixels 12 are disposed on both sides of the third sub-pixel 13 in the third direction D3, respectively, and the other two are disposed on both sides of the third sub-pixel 13 in the fourth direction D4, respectively. Similarly, four second sub-pixels 12 are disposed around one first sub-pixel 11, one second sub-pixel 12 is disposed on each of two opposite sides of the first sub-pixel 11 along the third direction D3, and one second sub-pixel 12 is disposed on each of two opposite sides of the first sub-pixel 11 along the fourth direction D4. Accordingly, the third sub-pixel 13 protrudes away from the inside of the third sub-pixel 13 (as indicated by a dotted line A in FIG. 2) corresponding to the depression of the adjacent second sub-pixels 12 in the third direction D3 and in the fourth direction D4, thereby increasing the aperture ratio of the third sub-pixel 13.

Optionally, as shown in FIG. 2, at least one of the plurality of second sub-pixels 12 further includes a third side 123 and a fourth side 124 respectively close to two adjacent first sub-pixels 11 and opposite to each other, the third side 123 and the fourth side 124 are symmetrically disposed about a line connecting a center of the second sub-pixel 12 with a center of an adjacent first sub-pixel 11 in the first virtual square, which in turn passes through centers of the third side 123 and the fourth side 124. The centers of the third side 123 and the fourth side 124 are away from the center of the second sub-pixel 12 in the first virtual square with respect to points, other than the centers of the third side 123 and the fourth side 124 along a direction of the line connecting the center of the second sub-pixel 12 and the center of the adjacent first sub-pixel 11 in the first virtual square. Accordingly, in the first virtual square SQ1, fifth and sixth sides 111 and 112 of the first sub-pixels 11, which are adjacent to the protruded third and fourth sides of the second sub-pixel 12, are depressed toward the inside of the corresponding first sub-pixels 11 in the fourth direction D4 (as indicated by the dotted line B in FIG. 2): in the second virtual square SQ2, seventh and eighth sides 113 and 114 of the first sub-pixels 11, which are adjacent to the protruded third and fourth sides of the second sub-pixel 12, are depressed toward the inside of the corresponding first sub-pixels 11 in the third direction D3. That is, the opposite third and fourth sides 123 and 124 of the second sub-pixel 12 are protruded, and the opposite first and second sides 121 and 122 are depressed. FIG. 2 illustrates only a case where the second sub-pixel 12 is a quadrangle, and the second sub-pixel 12 may be provided as other polygon as needed. For example, the second sub-pixel of the present disclosure is obtained by depressing sides of any one of a circle, an ellipse, a triangle, a pentagon, a hexagon, or an octagon, etc., in the third direction D3 or the fourth direction D4. In one specific example, the second sub-pixel of the present disclosure may be obtained, for example, by depressing opposite two long sides of the second sub-pixel in the elliptical shape shown in FIG. 1.

As shown in FIG. 2, in the first virtual square SQ1, the first side 121 and the second side 122 are symmetrically disposed about the line (i.e., the third direction D3) connecting the center of the second sub-pixel 12 and the center of the adjacent third sub-pixel 13 in the first virtual square, and the third side 123 and the fourth side 124 are symmetrically disposed about the line (i.e., the fourth direction D4) connecting the center of the second sub-pixel 12 and the center of the adjacent first sub-pixel 11 in the first virtual square. In the second virtual square SQ2 adjacent to the first virtual square SQ1, the first side 121 and the second side 122 are symmetrically disposed about the line (i.e., the fourth direction D4) connecting the center of the second sub-pixel 12 and the center of the adjacent third sub-pixel 13 in the first virtual square, and the third side 123 and the fourth side 124 are symmetrically disposed about the line (i.e., the third direction D3) connecting the center of the second sub-pixel 12 and the center of the adjacent first sub-pixel 11 in the first virtual square. The first virtual squares SQ1 and the first virtual squares SQ2 are alternately arranged in the row and column directions, respectively.

Optionally, a length of each of the first and second sides 121 and 122 are greater than that of each of the third and fourth sides 123 and 124. As shown in FIG. 2, the first side 121 and the second side 122 opposite to each other are used as long sides of the second sub-pixel 12 and substantially extend along a direction of a line connecting the center of the first sub-pixel and the center of the adjacent second sub-pixel: the third side 123 and the fourth side 124 opposite to each other are used as short sides of the second sub-pixel 12 and substantially extend along a direction of a line connecting the center of the third sub-pixel 13 and the center of the adjacent second sub-pixel Optionally, the first, second, third and fourth sides 121, 122, 123 and 124 are all arc-shaped, as shown in FIG. 2, but the present disclosure is not limited thereto. The first, second, third and fourth sides 121, 122, 123 and 124 may also have other concave or convex shapes, and the lengths of the first and second sides 121 and 123 are equal to each other, and the lengths of the third and fourth sides 123 and 124 are equal to each other.

Optionally, two adjacent first virtual squares share a common side, and the two second sub-pixels 12 in the two adjacent first virtual squares are symmetrically disposed about a common side. As shown in FIG. 2, first virtual squares SQ1 and SQ2 adjacent to each other share a common side Q1, and the second sub-pixels 12 in the first virtual squares SQ1 and SQ2 are symmetrically arranged about the common side Q1, i.e. mirror-symmetrical about the common side Q, thereby forming the second sub-pixels 12 arranged in the array shown in FIG. 2.

Optionally, as shown in FIG. 2, a ratio among a first minimum distance d12 between each of the plurality of first sub-pixels 11 and an adjacent one of the plurality of second sub-pixels 12, a second minimum distance d13 between the first sub-pixel 11 and an adjacent third sub-pixel 13, and a third minimum distance d23 between the second sub-pixel 12 and the third sub-pixel 13 may be d12: d13: d23=1: (0.8 to 1.2): (0.8 to 1.2). Optionally, d12: d13: d23=1:1: 1, i.e., d12, d13, d23 are equal to each other. For example, d12, d13, and d23 may all be between 14.4 µm and 21.6 µm. In one particular example, d12, d13, and d23 may each be 18 µm. Distances between centers of the sub-pixels may be set based on sizes of the sub-pixels. The minimum distance represents a distance between the nearest two points on two adjacent sub-pixels.

Optionally, as shown in FIG. 2, a ratio among an area S1 of one of the plurality of first sub-pixels 11, a sum S2 of areas of two of the plurality of second sub-pixels 12, and an area S3 of one of the plurality of third sub-pixels 13 is S1: S2: S3=7.1: (5.6 to 8.4): (10.4 to 15.6). In one specific example, the ratio among the area S1 of one of the plurality of first sub-pixels 11, the sum S2 of the areas of two of the plurality of second sub-pixels 12, and the area S3 of one of the plurality of third sub-pixels 13 is S1: S2: S3=7.1:7: 13. Compared to a ratio of 7.1:8.4:10.6 among the area S1 of one of the plurality of first sub-pixels 11, the sum S2 of the areas of two of the plurality of second sub-pixels 12, and the area S3 of one of the plurality of third sub-pixels 13 in the related art, the aperture ratio of the third sub-pixel 13 of the present disclosure is increased.

Optionally, as shown in FIG. 2, a ratio among an area S1 of one of the plurality of first sub-pixels 11, a sum S2 of areas of two of the plurality of second sub-pixels 12, and an area S3 of one of the plurality of third sub-pixels 13 is S1: S2: S3=7.1:(10.4 to 15.6): (5.6 to 8.4). In one specific example, the ratio among the area S1 of one of the plurality of first sub-pixels 11, the sum S2 of the areas of two of the plurality of second sub-pixels 12, and the area S3 of one of the plurality of third sub-pixels 13 is S1: S2: S3=7.1:7:13. Compared to a ratio of 7.1:8.4:10.6 among the area S1 of one of the plurality of first sub-pixels 11, the sum S2 of the areas of two of the plurality of second sub-pixels 12, and the area S3 of one of the plurality of third sub-pixels 13 in the related art, the aperture ratio of the third sub-pixel 13 of the present disclosure is increased.

Optionally, as shown in FIG. 2, the first direction D1 is perpendicular to the second direction D2, and the line connecting the center of the second sub-pixel 12 and the center of the adjacent third sub-pixel 13 in the first virtual square is perpendicular to the line connecting the center of the second sub-pixel 12 and the center of the adjacent first sub-pixel 11 in the same first virtual square, that is, the third direction D3 is perpendicular to the fourth direction D4 or the fourth direction D4 is perpendicular to the third direction D3. The line connecting the center of the second sub-pixel 12 and the center of the adjacent third sub-pixel 13 in the first virtual square has an included angle with the first direction D1 in a range from 36° to 54°. In one particular example, each of the third and fourth directions D3 and D4 may have an included angle with the first direction D1, for example, in a range of 36° to 40°, 41° to 45°, 45° to 50°, or 51° to 54°.

Optionally, as shown in FIG. 2, the centers of the plurality of first sub-pixels 11 and the centers of the plurality of third sub-pixels 13 in the same row or the same column are located on a same straight line, and the centers of the plurality of second sub-pixels 12 in the same row or the same column are located on a same straight line. In the same row, a center of one of the plurality of first sub-pixels 11 is located on a center line of the line connecting centers of two third sub-pixels 13 adjacent to the first sub-pixel 11: in the same column, a center of one of the plurality of first sub-pixels 11 is located on a center line of the line connecting centers of two third sub-pixels 13 adjacent to the first sub-pixel 11. In the same row, a center of one of the plurality of third sub-pixels 13 is located on a center line of the line connecting centers of two first sub-pixels 11 adjacent to the third sub-pixel 13: in the same column, a center of one of the plurality of third sub-pixels 13 is located on a center line of the line connecting centers of two first sub-pixels 11 adjacent to the third sub-pixel 13. That is, the plurality of first sub-pixels, the plurality of second sub-pixels, and the plurality of third sub-pixels constitute a uniformly distributed sub-pixel array in rows and columns.

Optionally, as shown in FIG. 2, a shape of each of the first sub-pixel 11 and the third sub-pixel 13 may be an axisymmetric pattern having a symmetry axis. As shown in FIG. 2, symmetry axes of the first sub-pixel 11 and the third sub-pixel 13 may include symmetry axes along the first direction D1 and the second direction D2, respectively, i.e., the first sub-pixel 11 and the third sub-pixel 13 are axisymmetric patterns along the first direction D1 and the second direction D. However, the present disclosure is not limited thereto, and the shape of each of the first and second sub-pixels 11 and 12 may be an axisymmetric pattern having symmetry axes in other directions.

Optionally, as shown in FIG. 2, at least one of the first sub-pixels 11 includes fifth and sixth sides 111 and 112 opposite to each other and seventh and eighth sides 113 and 114 opposite to each other. The fifth and sixth sides 111 and 112 of at least one of the plurality of first sub-pixels 11 are symmetrically disposed about a line connecting the center of the first sub-pixel 11 and the center of the second sub-pixel 12 adjacent to the fifth or sixth side 111 or 112, which in turn passes through centers of the fifth and sixth sides 111 and 112. The seventh and eighth sides 113 and 114 of at least one of the plurality of first sub-pixels 11 are symmetrically disposed about a line connecting the center of the first sub-pixel 11 and the center of the second sub-pixel 12 adjacent to the seventh or eighth side 113 or 114, which in turn passes through centers of the seventh and eighth sides 113 and 114. Both ends of the seventh side 113 are respectively connected to one end of the fifth side 111 and one end of the sixth side, and both ends of the eighth side 114 are respectively connected to the other end of the fifth side 111 and the other end of the sixth side, whereby the fifth side, the sixth side, the seventh side, and the eighth side are sequentially connected end to end, to form a closed quadrangle. The present disclosure is not limited thereto, and the first sub-pixel 11 may also be other polygon.

Optionally, as shown in FIG. 2, the centers of the fifth side 111 and the sixth side 112 of at least one of the plurality of first sub-pixels 11 are close to the center of the first sub-pixel 11 with respect to points, other than the centers of the fifth and sixth sides 111 and 112 along a direction of the line connecting the center of the first sub-pixel 11 and the center of the second sub-pixel 12 adjacent to the fifth or sixth side 111 or 112. The centers of the seventh and eighth sides 113 and 114 of at least one of the plurality of first sub-pixels 11 are close to the center of the first sub-pixel with respect to points, other than the centers of the seventh and eighth sides 113 and 114 along a direction of the line connecting the center of the first sub-pixel 11 and the center of the second sub-pixel 12 adjacent to the seventh or eighth side 113 or 114. That is, the fifth, sixth, seventh, and eighth sides are each depressed toward the inside of the corresponding first sub-pixel 11.

Optionally, as shown in FIG. 2, the fifth, sixth, seventh and eighth sides are equal in length, and are each arc-shaped. Thereby, the area of the first sub-pixel 11 may be reduced, thereby increasing the area of the third sub-pixel 13.

As shown in FIG. 2, according to the pixel array of the present disclosure, an opening of the second (green) sub-pixel is provided as including the first side and the second side close to adjacent third sub-pixels and opposite to each other, wherein the first side and the second side are depressed toward a direction of the center of the second sub-pixel along the direction of the line connecting the center of the second sub-pixel and the center of the adjacent third sub-pixel, that is, the second sub-pixel is shaped like a "bone", so that the aperture ratio of the second sub-pixel may be reduced, and the aperture ratio of the third sub-pixel may be increased, thereby improving the lifetime of the third sub-pixel.

According to another aspect of the present disclosure, there is provided a display apparatus, including the pixel array and a driving circuit for driving the pixel array. The above pixel array is adopted in the display apparatus of the present disclosure, so that the aperture ratio of the third sub-pixel may be increased, and the service life of the third sub-pixel is further prolonged.

Figure 3:
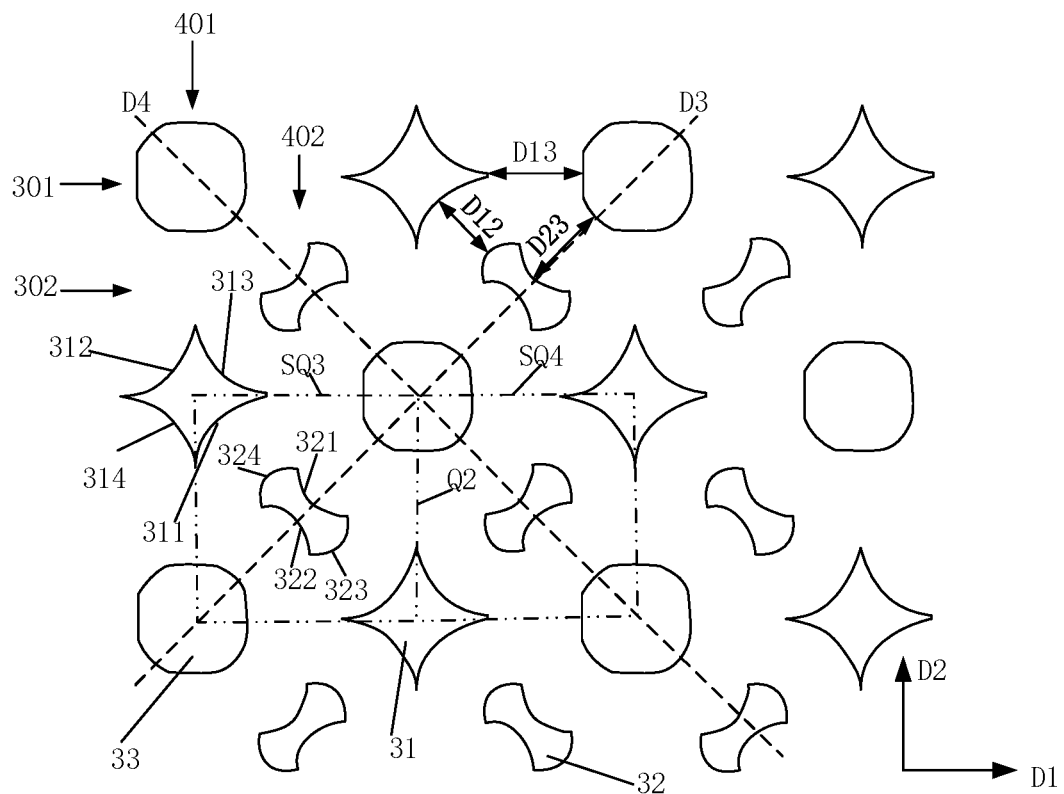
FIG. 3 is a schematic diagram of an etching mask according to an embodiment of the present disclosure.

According to another aspect of the present disclosure, an etching mask is provided. FIG. 3 is a schematic diagram illustrating an etching mask according to an embodiment of the present disclosure. As shown in FIG. 3, the etching mask includes a plurality of openings 30, and the plurality of openings 30 includes a plurality of first openings 31, a plurality of second openings 32, and a plurality of third openings 33. The first and third openings 31 and 33 are alternately arranged in the first direction D1 to form a plurality of first opening rows 301, the second openings 32 are arranged in the first direction D2 to form a plurality of second opening rows 302, and the plurality of first opening rows 301 and the plurality of second opening rows 302 are alternately arranged in the second direction D2. Also, the first and third openings 31 and 33 are alternately arranged in the second direction D2 to form a plurality of first opening columns 401, the second openings 32 are also arranged in the second direction D2 to form a plurality of second opening columns 402, and the plurality of first opening columns 401 and the plurality of second opening columns 402 are alternately arranged in the first direction D1. The second direction D2 is different from the first direction D1. For example, the first direction D1 may be a row direction, the second direction D2 may be a column direction, and the first direction D1 may be perpendicular to the second direction D2. That is, the plurality of first openings 31, the plurality of second openings 32, and the plurality of third openings 33 constitute a uniformly distributed opening array in rows and columns, and the first openings 31, the second openings 32, and the third openings 33 are used to form the first sub-pixels 11, the second sub-pixels 12, and the third sub-pixels 13, respectively.

Optionally, lines, sequentially connecting centers of two first openings 31 and centers of two third openings 13 in two adjacent first opening rows of the plurality of first opening rows 301 and two adjacent first opening columns of the plurality of first opening columns 401, constitute a second virtual square. One of the plurality of second openings 32 is located at a center of the second virtual square: the centers of the two first openings 31 and the centers of the two third openings 32 are located at four vertexes of the second virtual square, respectively. At least one of the plurality of second openings 32 includes a ninth side 321 and a tenth side 322 respectively close to two adjacent third openings 33 and opposite to each other, and the ninth and tenth sides 321 and 322 are symmetrically disposed about a line connecting a center of the second opening 32 and a center of an adjacent third opening 33 in the second virtual square, which in turn passes through centers of the ninth and tenth sides 321 and 322.

Optionally, at least one of the plurality of second openings 32 further includes an eleventh side 323 and a twelfth side 324 respectively close to two adjacent first openings 31 and opposite to each other, the eleventh side 323 and the twelfth side 324 are symmetrically disposed about a line connecting a center of the second opening 32 with a center of an adjacent first opening 31 in the second virtual square, which in turn passes through centers of the eleventh side 323 and the twelfth side 324.

Optionally, centers of the ninth side 321 and the tenth side 322 of at least one of the plurality of second openings 32 are close to the center of the second opening 32 in the second virtual square with respect to points, other than the center of the ninth side 321 or the tenth side 322 along a direction of the line connecting the center of the second opening 32 and the center of the adjacent third opening 33 in the second virtual square. Centers of the eleventh side 323 and the twelfth side 324 of at least one of the plurality of second openings 32 are away from the center of the second opening in the second virtual square with respect to points, other than the center of the eleventh side 323 or the twelfth side 324 along a direction of the line connecting the center of the second opening 32 and the center of the adjacent first opening 31 in the second virtual square.

As shown in FIG. 3, in a second virtual square SQ3, the ninth and tenth sides 321 and 322 are symmetrically disposed about the line (i.e., the third direction D3) connecting the center of the second opening 32 and the center of the adjacent third opening 33 in the second virtual square, and the eleventh and twelfth sides 323 and 324 are symmetrically disposed about the line (i.e., the fourth direction D4) connecting the center of the second opening 32 and the center of the adjacent first opening 31 in the second virtual square. In a second virtual square SQ4 adjacent to the second virtual square SQ3, the ninth and tenth sides 321 and 322 are symmetrically disposed about the line (i.e., the fourth direction D4) connecting the center of the second opening 32 and the center of the adjacent third opening 33 in the second virtual square, and the eleventh and twelfth sides 323 and 324 are symmetrically disposed about the line (i.e., the third direction D3) connecting the center of the second opening 32 and the center of the adjacent first opening 31 in the second virtual square. The second virtual squares SQ3 and SQ4 are alternately arranged in the row and column directions, respectively.

Optionally, each of the ninth and tenth sides 321, 322 has a length greater than that each of the eleventh and twelfth sides 323, 324. As shown in FIG. 3, the ninth side 321 and the tenth side 322 opposite to each other are long sides of the second opening 32 and substantially extend along a line connecting a center of the first opening and a center of an adjacent second opening: the eleventh and twelfth sides 323, 324 opposite to each other are short sides of the second opening 32 and substantially extend along a line connecting a center of the third opening and a center of an adjacent second opening.

Optionally, the ninth, tenth, eleventh, and twelfth sides 321, 322, 323, and 324 are each arc-shaped, as shown in FIG. 3, but the present disclosure is not limited thereto, and the ninth, tenth, eleventh, and twelfth sides 321, 322, 323, and 324 may also have other concave or convex shapes.

Optionally, two adjacent second virtual squares share a common side, and the two second openings in the two adjacent second virtual squares are symmetrically disposed about a common side. As shown in FIG. 3, second virtual squares SQ3 and SQ4 adjacent to each other share a common side Q2, and the second openings in the second virtual squares SQ3 and SQ4 are symmetrically arranged about the common side Q2, i.e. mirror-symmetrical about the common side Q2, thereby forming the second openings arranged in the array shown in FIG. 3.

Optionally, a ratio among a first minimum distance D12 between each of the plurality of first openings 31 and an adjacent one of the plurality of second openings 32, a second minimum distance D13 between the first openings 31 and an adjacent third openings 33, and a third minimum distance D23 between the second openings 32 and the third openings 33 may be D12: D13: D23=1: (0.8 to 1.2): (0.8 to 1.2). For example, D12, D13, and D23 may all be between 14.4 μm and 21.6 μm. In one particular example, D12, D13, and D23 may each be 18 μm. Distances between centers of the openings may be set based on sizes of the sub-pixels. The minimum distance represents a distance between the nearest two points on two adjacent openings.

Optionally, as shown in FIG. 3, a ratio among an area s1 of one of the plurality of first openings 31, a sum s2 of areas of two of the plurality of second openings 32, and an area s3 of one of the plurality of third openings 33 is s1: s2: s3=7.1: (56 to 8.4) :(10.4 to 15.6). In one specific example, the ratio among the area s1 of one of the plurality of first openings 31, the sum s2 of the areas of two of the plurality of second openings 32, and the area s3 of one of the plurality of third openings 33 is S1: S2: S3=7.1:7: 13. Compared to a ratio of 7.1:8.4:10.6 among the area s1 of one of the plurality of first openings 31, the sum s2 of the areas of two of the plurality of second openings 32, and the area s3 of one of the plurality of third openings 33 in the related art, the aperture ratio of the third openings 33 of the present disclosure is increased.

Optionally, as shown in FIG. 3, a ratio among an area s1 of one of the plurality of first openings 31, a sum s2 of areas of two of the plurality of second openings 32, and an area s3 of one of the plurality of third openings 33 is s1: s2: s3=7.1:(10.4 to 15.6):(5.6 to 8.4). In one specific example, the ratio among the area s1 of one of the plurality of first openings 31, the sum s2 of the areas of two of the plurality of second openings 32, and the area s3 of one of the plurality of third openings 33 is S1: S2: S3=7.1:7:13. Compared to a ratio of 7.1:8.4:10.6 among the area s1 of one of the plurality of first openings 31, the sum s2 of the areas of two of the plurality of second openings 32, and the area s3 of one of the plurality of third openings 33 in the related art, the aperture ratio of the third openings 33 of the present disclosure is increased.

Optionally, as shown in FIG. 3, at least one of the first openings 31 includes a thirteenth side 311 and a fourteenth side 312 opposite to each other and a fifteenth side 313 and a sixteenth side 314 opposite to each other. The thirteenth and fourteenth sides 311 and 312 of at least one of the plurality of first openings 31 are symmetrically disposed about a line connecting the center of the first opening 31 and the center of the second opening 32 adjacent to the thirteenth or fourteenth sides 311 or 312, which in turn passes through centers of the thirteenth and fourteenth sides 311 and 312. The fifteenth and sixteenth sides 313 and 314 of at least one of the plurality of first sub-pixels 11 are symmetrically disposed about a line connecting the center of the first opening 31 and the center of the second opening 32 adjacent to the fifteenth or sixteenth side 313 or 314, which in turn passes through the centers of the fifteenth and sixteenth sides 313 and 314.

Optionally, as shown in FIG. 3, the centers of the thirteenth side 311 and the fourteenth side 312 of at least one of the plurality of first openings 31 are close to the center of the first opening 31 with respect to points, other than the centers of the thirteenth side 311 and the fourteenth side 312 along a direction of the line connecting the center of the first opening 31 and the center of the second opening 32 adjacent to the thirteenth or fourteenth side 311 or 312: and the centers of the fifteenth side 313 and the sixteenth side 314 of at least one of the plurality of first openings 31 are close to the center of the first opening 31 with respect to points, other than the centers of the fifteenth side 313 and the sixteenth side 314 along a direction of the line connecting the center of the first opening 31 and the center of the second opening 32 adjacent to the fifteenth side 313 or the sixteenth side 314.

Optionally, as shown in FIG. 3, the thirteenth side 311, the fourteenth side 312, the fifteenth side 313 and the sixteenth side 314 are equal in length, and are each arc-shaped.

Generally, the etching mask is used to form a pixel defining layer of the display panel. Specifically, after a pixel defining material layer is formed on a base substrate, a patterning process is performed on the pixel defining material layer by using the etching mask to form openings required for first sub-pixels, second sub-pixels and third sub-pixels.

Figure 4A:
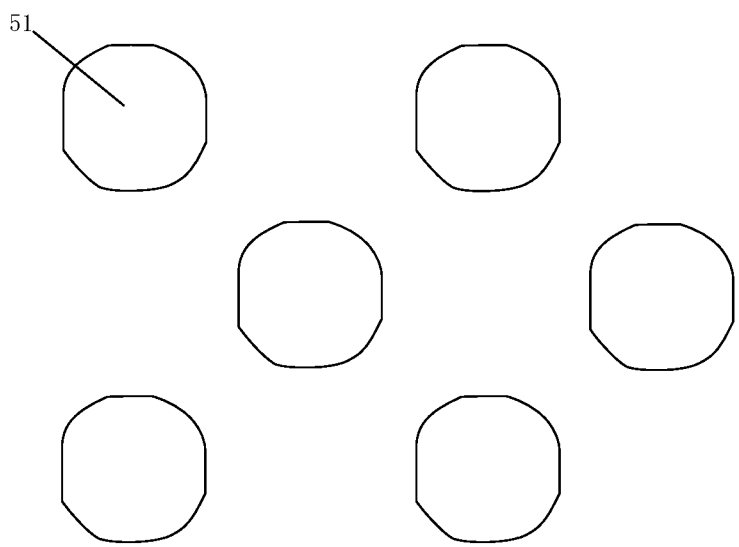
FIGS. 4a to 4c are schematic diagrams of fine metal masks (FMM) according to an embodiment of the present disclosure.
Figure 4B:
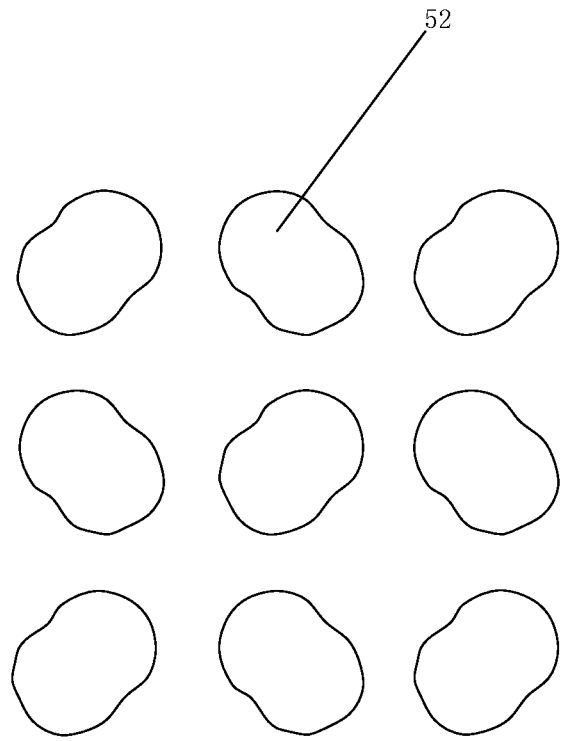
Figure 4C:
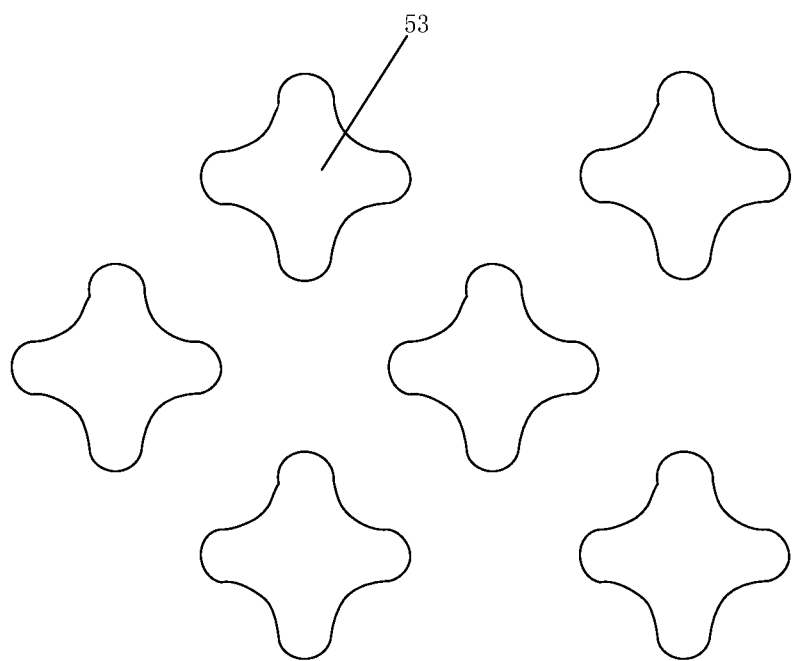
Figure 5:
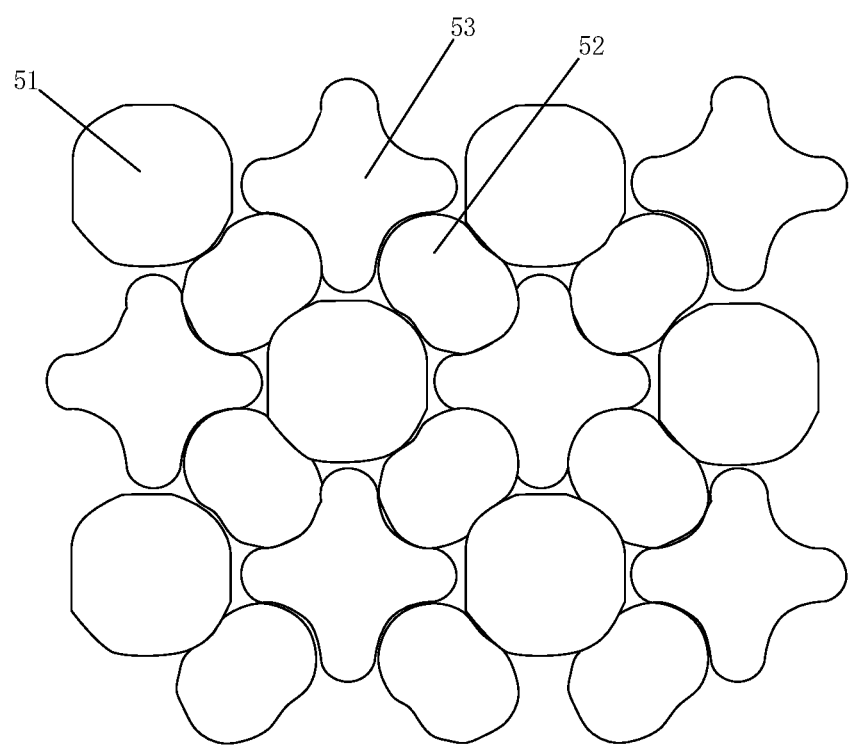
FIG. 5 is a schematic diagram illustrating a positional relationship among orthographic projections of holes of the fine metal masks shown in FIGS. 4a to 4c.

After the openings of the first sub-pixels, the second sub-pixels, and the third sub-pixels are formed, an organic light emitting layer of the organic light emitting device is formed using FMMs. FIGS. 4a to 4c are schematic diagrams of the FMMs (abbreviated) according to embodiments of the present disclosure. As shown in FIGS. 4a to 4c, the FMMs are provided with a plurality of first holes 51 corresponding to the openings of the first sub-pixels, a plurality of second holes 52 corresponding to the openings of the second sub-pixels, and a plurality of third holes 53 corresponding to the openings of the third sub-pixels, respectively, and areas of one of the plurality of first holes 51, one of the plurality of second holes 52, and one of the plurality of third holes 53 in the FMMs are greater than those of the corresponding openings of the first sub-pixel, the second sub-pixel, and the third sub-pixel, respectively. That is, when the FMMs are used, orthographic projections of the openings of the first sub-pixels, the second sub-pixels, and the third sub-pixels on the display panel are located in orthographic projections of the corresponding holes in the FMMs on the display panel, to ensure efficient filling of the organic light emitting material into each opening. Optionally, shapes of the first, second and third holes in the FMMs may be the same as those of the corresponding openings of the first, second and third sub-pixels. By sequentially using the FMMs as shown in FIGS. 4a to <19, corresponding light emitting layers may be formed in the openings of the first sub-pixels, the second sub-pixels, and the third sub-pixels, respectively, and a positional relationship between the orthographic projections of the holes in the FMMs as shown in FIGS. 4a to 4b 4s on the display panel is as shown in FIG. 5.

By adopting the etching mask and the FMMs, the sub-pixel openings shown in FIG. 2 may be formed, the aperture ratio of the third sub-pixel may be increased, and the service life of the third sub-pixel is prolonged.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A pixel array, comprising a plurality of first sub-pixels having a first color, a plurality of second sub-pixels having a second color, and a plurality of third sub-pixels having a third color; wherein
    the plurality of first sub-pixels and the plurality of third sub-pixels are alternately arranged in a first direction to form a plurality of first sub-pixel rows; the plurality of second sub-pixels are arranged in the first direction to form a plurality of second sub-pixel rows; the plurality of first sub-pixel rows and the plurality of second sub-pixel rows are alternately arranged in a second direction; and the plurality of first sub-pixels and the plurality of third sub-pixels are alternately arranged in the second direction to form a plurality of first sub-pixel columns; the plurality of second sub-pixels are arranged in the second direction to form a plurality of second sub-pixel columns; the plurality of first sub-pixel columns and the plurality of second sub-pixel columns are alternately arranged in the first direction; the second direction is different from the first direction, and
    wherein at least a portion of each of at least one first sub-pixel of the plurality of first sub-pixels comprises an inward indentation, at least a portion of each of at least one second sub-pixel of the plurality of second sub-pixels comprises an inward indentation, and each of at least one of the plurality of third sub-pixels adjacent to the at least one second sub-pixel comprises an outward protrusion corresponding to the inward indentation of the at least one second sub-pixel;
    wherein lines, sequentially connecting centers of two first sub-pixels and centers of two third sub-pixels in two adjacent first sub-pixel rows of the plurality of first sub-pixel rows and two adjacent first sub-pixel columns of the plurality of first sub-pixel columns, constitute a first virtual square;
    one of the plurality of second sub-pixels is at a center of the first virtual square; and
    the centers of the two first sub-pixels and the centers of the two third sub-pixels are at four vertexes of the first virtual square, respectively;
    wherein the at least one second sub-pixel each comprises a first side and a second side opposite to each other, which are respectively close to two adjacent third sub-pixels, the first side and the second side are symmetrically arranged about a line connecting a center of the second sub-pixel and the centers of the two adjacent third sub-pixels in the first virtual square, and this line passes through centers of the first side and the second side; and wherein the centers of the first side and the second side are on the line connecting the center of the second sub-pixel and the centers of the two adjacent third sub-pixels in the first virtual square and closer to the center of the second sub-pixel in the first virtual square than points, other than the centers of the first side and the second side, of the first side and the second side.

2. The pixel array of claim 1, wherein the at least one second sub-pixel each comprises a third side and a fourth side opposite to each other, which are respectively close to two adjacent first sub-pixels, the third side and the fourth side are symmetrically arranged about a line connecting a center of the second sub-pixel with centers of the two adjacent first sub-pixels in the first virtual square, and this line passes through centers of the third side and the fourth side.

3. The pixel array of claim 2, wherein the first direction is perpendicular to the second direction, and the line connecting the center of the second sub-pixel and the centers of the two adjacent third sub-pixels in the first virtual square is perpendicular to the line connecting the center of the second sub-pixel and the centers of the two adjacent first sub-pixels in the same first virtual square, and has an included angle with respect to the first direction in a range from 36° to 54°.

4. The pixel array of claim 1, wherein the centers of the third side and the fourth side are on the line connecting the center of the second sub-pixel and the centers of the two adjacent first sub-pixels in the first virtual square and are farther away from the center of the second sub-pixel in the first virtual square than points, other than the centers of the third side and the fourth side, of the third side and the fourth side.

5. The pixel array of claim 4, wherein each of the first side and the second side has a length greater than that of each of the third side and the fourth side.

6. The pixel array of claim 5, wherein the first side, the second side, the third side, and the fourth side are each arc-shaped.

7. The pixel array of claim 6, wherein two adjacent first virtual squares share a common side, and two second sub-pixels of the two adjacent first virtual squares are symmetrically arranged about the common side.

8. The pixel array of claim 7, wherein the first color is red, the second color is green, and the third color is blue.

9. The pixel array of claim 8, wherein a ratio among a first minimum distance d12 between each of the plurality of first sub-pixels and an adjacent one of the plurality of second sub-pixels, a second minimum distance d13 between each of the plurality of first sub-pixels and an adjacent one of the plurality of third sub-pixels, and a third minimum distance d23 between each of the plurality of second sub-pixels and an adjacent one of the plurality of third sub-pixels is d12: d13: d23=1: (0.8 to 1.2): (0.8 to 1.2).

10. The pixel array of claim 9, wherein each of the first minimum distance, the second minimum distance, and the third minimum distance is in a range of 14.4 μm to 21.6 μm.

11. The pixel array of claim 10, wherein each of the first minimum distance, the second minimum distance, and the third minimum distance is 18 μm.

12. The pixel array of claim 11, wherein a ratio among an area S1 of one of the plurality of first sub-pixels, a sum S2 of areas of two of the plurality of second sub-pixels, and an area S3 of one of the plurality of third sub-pixels is S1: S2: S3=7.1: (5.6 to 8.4): (10.4 to 15.6).

13. The pixel array of claim 12, wherein the ratio among the area S1 of one of the plurality of first sub-pixels, the sum S2 of areas of two of the plurality of second sub-pixels, and the area S3 of one of the plurality of third sub-pixels is S1: S2: S3=7.1:7: 13.

14. The pixel array of claim 1, wherein the at least one first sub-pixel each comprises a fifth side and a sixth side opposite to each other and a seventh side and an eighth side opposite to each other;

the fifth side and the sixth side are symmetrically arranged about a line connecting the center of the first sub-pixel and the center of the second sub-pixel adjacent to the fifth side or the sixth side, and this line passes through centers of the fifth side and the sixth side; and the seventh side and the eighth side are symmetrically arranged about a line connecting the center of the first sub-pixel and the center of the second sub-pixel adjacent to the seventh side or the eighth side, and this line passes through centers of the seventh side and the eighth side.

15. The pixel array of claim 14, wherein the centers of the fifth side and the sixth side are on the line connecting the center of the first sub-pixel and the center of the second sub-pixel adjacent to the fifth side or the sixth side and closer to the center of the first sub-pixel than points, other than the centers of the fifth side and the sixth side, of the fifth side and the sixth side; and the centers of the seventh side and the eighth side are on the line connecting the center of the first sub-pixel and the center of the second sub-pixel adjacent to the seventh side or the eighth side and closer to the center of the first sub-pixel than points, other than the centers of the seventh side and the eighth side, of the seventh side and the eighth side.

16. The pixel array of claim 15, wherein the fifth side, the sixth side, the seventh side, and the eighth side have a same length, and are each arc-shaped.

17. A display apparatus, comprising the pixel array of claim 1 and a drive circuit for driving the pixel array.

* * * * *